(12) United States Patent  
Perloff (10) Patent No.: US 6,671,771 B2
(45) Date of Patent: *Dec. 30, 2003

(54) HASH CAM HAVING A REDUCED WIDTH COMPARISON CIRCUITRY AND ITS APPLICATION

(75) Inventor: Ronald S. Perloff, Poway, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 32 days.

(21) Appl. No.: 09/468,477

(22) Filed: Dec. 21, 1999

(65) Prior Publication Data

US 2003/0188089 A1 Oct. 2, 2003

(51) Int. Cl.[7] .............................................. G06F 12/08
(52) U.S. Cl. ...................................... 711/108; 711/216
(58) Field of Search .................................. 711/216, 108

(56) References Cited

U.S. PATENT DOCUMENTS

| | | | | |
|---|---|---|---|---|
| 5,414,704 A | * | 5/1995 | Spinney | 370/389 |
| 5,764,895 A | * | 6/1998 | Chung | 370/402 |
| 5,870,324 A | * | 2/1999 | Helwig et al. | 365/230.03 |
| 6,240,000 B1 | * | 5/2001 | Sywyk et al. | 365/189.05 |
| 6,418,042 B1 | * | 7/2002 | Srinivasan et al. | 365/49 |
| 6,424,714 B1 | * | 7/2002 | Wasilewski et al. | 380/200 |

* cited by examiner

*Primary Examiner*—Kevin L. Ellis
*Assistant Examiner*—Midys Inoa
(74) *Attorney, Agent, or Firm*—Blakely, Sokoloff, Taylor & Zafman LLP (57) ABSTRACT

A hash CAM is provided with a first and a second memory array, and comparison circuitry. The first memory array is used to store an m-bit input in a partitioned manner suitable for being subsequently output in a successive manner in portions of size m/p, where m and p are positive integers, with m being greater than or equal to p. The second memory array is used to store a plurality of threaded lists of entries, with each entry having a comparand also m-bit in size and stored in the same partitioned manner suitable for being selectively output in the same successive manner in portions of size m/p. The successive output is made responsive to an n-bit index generated in accordance with the m-bit input, with n being also a positive integer, but smaller than m. The comparison circuitry, which is complementarily reduced in width, is used to successively compare corresponding portions of the m-bit input and the selectively output comparand (s) to cumulatively determine if the m-bit input relates to one of the output comparands in a predetermined manner. In each of a number of applications, a look-up engine is provided with the hash CAM. In one particular application, a forwarding section of a networking device is provided with such look-up engine.

27 Claims, 5 Drawing Sheets

HASH CAM HAVING A REDUCED WIDTH COMPARISON CIRCUITRY AND ITS APPLICATION

BACKGROUND OF THE INVENTION

1. Field of the Invention

The present invention relates to the field of data processing and data communication. More specifically, the present invention relates to the design of hash CAM (content addressable memory) used in data processing and data communication devices.

2. Background Information

Figure 1:
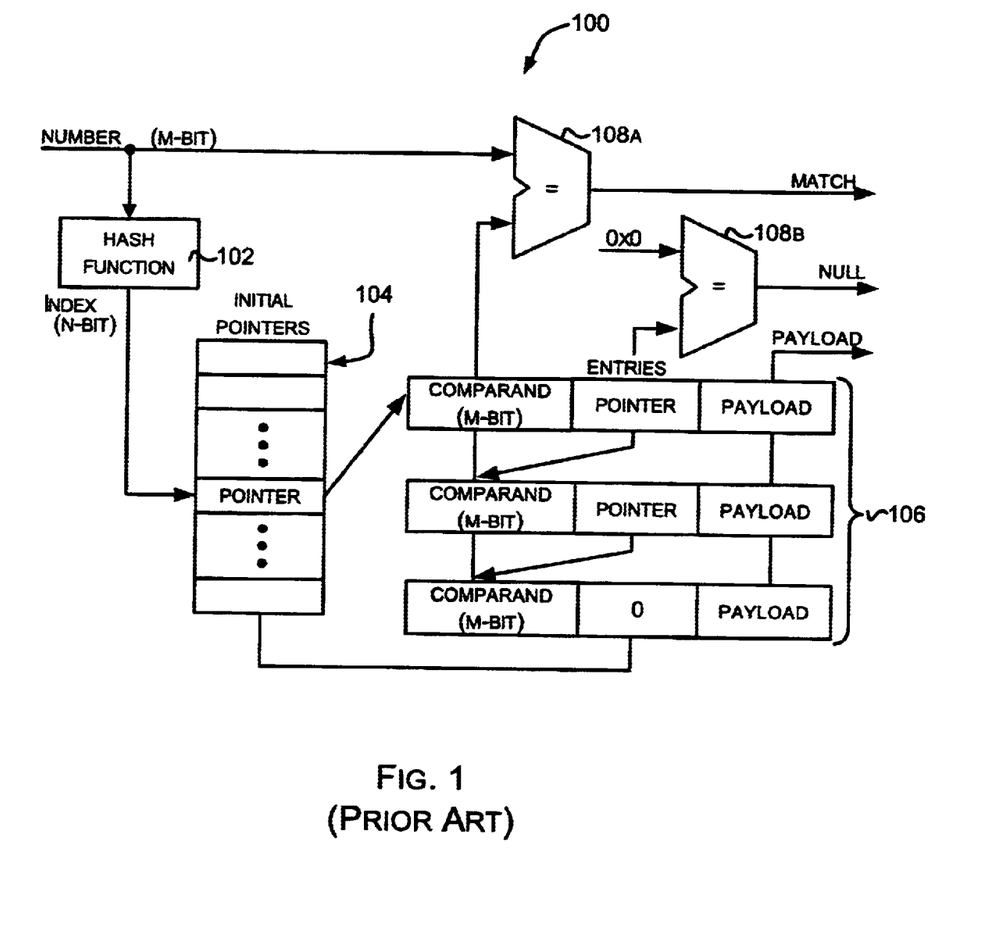
FIG. 1 illustrates a typical prior art hash CAM.

Numerous data processing and data communication applications employ a hash CAM for data look-up. Examples of these applications include but are not limited to network routers and switches looking up forwarding instructions for received frames. FIG. 1 illustrates a typical prior art hash CAM. Prior art hash CAM 100 is constituted with hash function 102, pointer array 104, memory array 106, and comparators 108a–108b. Hash function 102 is used to hash an m-bit input value to an n-bit index, where m and n are positive integers, with m greater than n. An example of hash function 102 is one that breaks the m-bit input into a number of vectors of size less than or equal to n and either EXCLUSIVE-OR all the vectors together, or add all the vectors together. Another example of hash function 102 is one that divides the m-bit input by an $n^{th}$ order polynomial, and uses the n-bit remainder as the index. Pointer array 104 is designed to store up to $2^n$ pointers pointing to $2^n$ starting memory locations of $2^n$ corresponding threaded lists of entries. Each entry includes a comparand, a payload and a next entry pointer (with the "last" next entry pointer of each threaded list set to "null" indicating the end of that particular list). Some of these lists may be "empty", in which case, the corresponding pointers in the pointer array would be "null". Memory array 106 is designed to store the threaded lists of entries. The payload of an indexed threaded list having the associated comparand that matches the m-bit input or an indication that no match was found is returned. Accordingly, each of the associated comparands is also m-bits in size. The nature of the payloads is application dependent. In the above mentioned network router/switch example, the payloads may be e.g. destination MAC addresses (MAC=media access control) or the number of the physical port to which the intended recipient is attached. Thus, comparator 108a is used to determine if an m-bit comparand matches an m-bit input, while comparator 108b is used to determine if the next pointer is a null pointer or not. Accordingly, comparator 108a is also m-bit in width.

Prior art hash CAMs of the type illustrated in FIG. 1 suffer from the disadvantage that they require large memory arrays and wide comparators for applications involving long input values, i.e. large m. For example, it is not uncommon for many networking applications where the m-bit input may be as long as 128 bits or longer. Thus, a more efficient hash CAM is desired

SUMMARY OF THE INVENTION

A hash CAM is provided with a first and a second memory array, and comparison circuitry. The first memory array is used to store an m-bit input in a partitioned manner suitable for being subsequently output in a successive manner in portions of size m/p, where m and p are positive integers, with m being greater than or equal to p. The second memory array is used to store a plurality of threaded lists of entries, with each entry having a comparand also m-bit in size and stored in the same partitioned manner suitable for being selectively output in the same successive manner in portions of size m/p. The successive output is made responsive to an n-bit index generated in accordance with the m-bit input, with n being also a positive integer, but smaller than m. The comparison circuitry, which is complementarily reduced in width, is used to successively compare corresponding portions of the m-bit input and the selectively output comparand(s) to cumulatively determine if the m-bit input relates to one of the output comparands in a pre-determined manner.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described, and various details will be set forth in order to provide a thorough understanding of the present invention. However, it will be apparent to those skilled in the art that the present invention may be practiced with only some or all aspects of the present invention, and the present invention may be practiced without the specific details. In other instances, well known features are omitted or simplified in order not to obscure the present invention. Furthermore, repeated usage of the phrase "in one embodiment" does not necessarily refer to the same embodiment, although it may.

Figure 2:
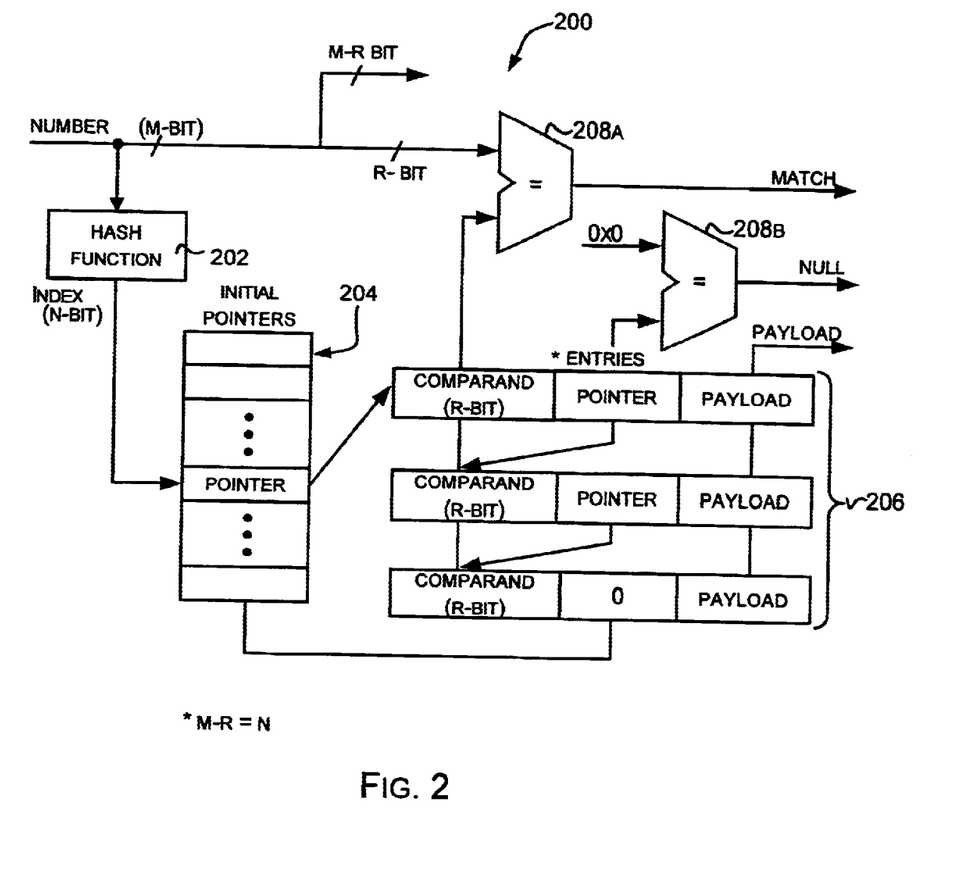
FIG. 2 illustrates the hash CAM of the present invention in accordance with one embodiment.

Referring now to FIG. 2, wherein the hash CAM of the present invention in accordance with one embodiment is shown. As illustrated, hash CAM 200 of the present invention is similarly constituted with hash function 202, pointer array 204, memory array 206, and comparators 208a–208b. However, hash CAM 200 is incorporated with the teachings of the present invention, resulting in reduced space requirement (more specifically, for memory array 206 and comparator 208a), when compared to the prior art, for handling the same size input hashed in like manner. That is, for a particular design point (m, n), hash CAM 200 of the represent invention requires less space than the prior art. As will be apparent from the description to follow, the larger n gets, the greater is the saving.

Hash function 202 is used similarly to hash an m-bit input value to an n-bit index, where m and n are also positive integers, with m greater than n. However, hash function 202 is preferably of a type where the n-bit index for each of $2^n$ m-bit inputs having m–n common bits, is always unique. That is, for any m-bit input, $x_1 x_2 \ldots x_{m-n} y_1 y_2 \ldots y_n$, the m-bit input is mapped to n-bit index $z_1 z_2 \ldots z_n$, where the n-bit index is unique for each of the $2^n$ variations Of $y_1y_2 \ldots Y_n$ (with the same $x_1x_2 \ldots x_{m-n}$), where $x_i$, $y_i$, and $z_k$ are bits. In other words, changing any or all of bits $y_1$ through $y_n$ will change at least one bit $z_k$. Hereafter, m–n may also be referred to as r, which by definition is also an integer. In one embodiment, hash function 202 is a function that generates the n-bit index by adding the m-bit input in a pre-determined manner to reduce the m-bit input to an n-bit value. For example, for a 4-bit input, a 2-bit index is generated by correspondingly adding the 2 most significant bits (MSB) to the 2 least significant bits (LSB). That is, for the 4-bit input 11 00, the resulting 2-bit index is 11. Note that for this hash function, the 2-bit indices generated for the 4-bit inputs 11 00, 11 01, 11 10, 11 11 are all different; respectively, they are 11, 10, 01 and 00. In another embodiment, hash function 202 is a function that generates the n-bit index by performing XOR operations on the m-bit input in a pre-determined manner to reduce the m-bit input to an n-bit value. In other embodiments, other hash functions with like properties may also be employed.

Pointer array 204 is similarly designed to store up to $2^n$ pointers pointing to the starting memory locations of up to $2^n$ corresponding threaded lists of entries. Each entry includes a comparand, a payload, and a next entry pointer (with the last next entry pointer of a threaded list set to "null")

Memory array 206 is similarly designed to store the earlier described entries. However, in accordance with the present invention, for each payload of an entry, only m–n or r pre-determined selected bits of its m-bit input are stored as the associated comparand. In other words, when storing the associated comparand, n selected bits are truncated from each potential m-bit input. The payload is returned for an m-bit input if the stored r-bit comparand matches the corresponding r selected bits of the m-bit input. Thus, a saving of n bits of storage for each stored entry is achieved. In one embodiment, each comparand is formed by truncating the n LSB of a potential m-bit input. In another embodiment, each comparand is formed by truncating the n MSB of a potential m-bit input. In yet another embodiment, each comparand is formed by truncating the n center bits of a potential m-bit input. In other embodiments, other manner of truncation may also be employed, as long as they are consistent and complementary to the hash function.

The nature of the payloads remains application dependent. The payload may still be various types of network addresses (including but not limited to the earlier mentioned MAC addresses or IP (Internet Protocol) addresses, for various networking applications. The m-bit input may be formed in part or in whole in accordance with a received address.

Comparator 208a is used to determine if an r-bit comparand matches the corresponding r-bits of an m-bit input. Thus, comparator 208a is also advantageously reduced in width to r bits from m bits, resulting in an n bit saving in width. That is, elimination of all circuit elements necessary to perform n bit comparisons. Therefore, in an embodiment where multiple comparator 208a, say q units, are provided to support e.g. concurrent look-up for q m-bit inputs, a saving of circuit elements necessary to support comparison of q×n bits may be achieved. Again, the savings could be substantial for large ns.

Note that in alternate embodiments, depending on the applications, the present invention may also be practiced with comparator 208a being replaced with other combinatorial circuitry to determine if the corresponding r bits of the m-bit input has a predetermined relationship to a stored r-bit comparand.

As to comparator 208b, as in the prior art, it is used to determine if the next pointer is a null pointer or not.

Thus, it can be seen from the above description, the FIG. 2 embodiment of hash CAM 200 of the present invention may achieve substantial savings in space, circuit area, and clock speed because, generally narrower comparisons can be performed more quickly.

Figure 3:
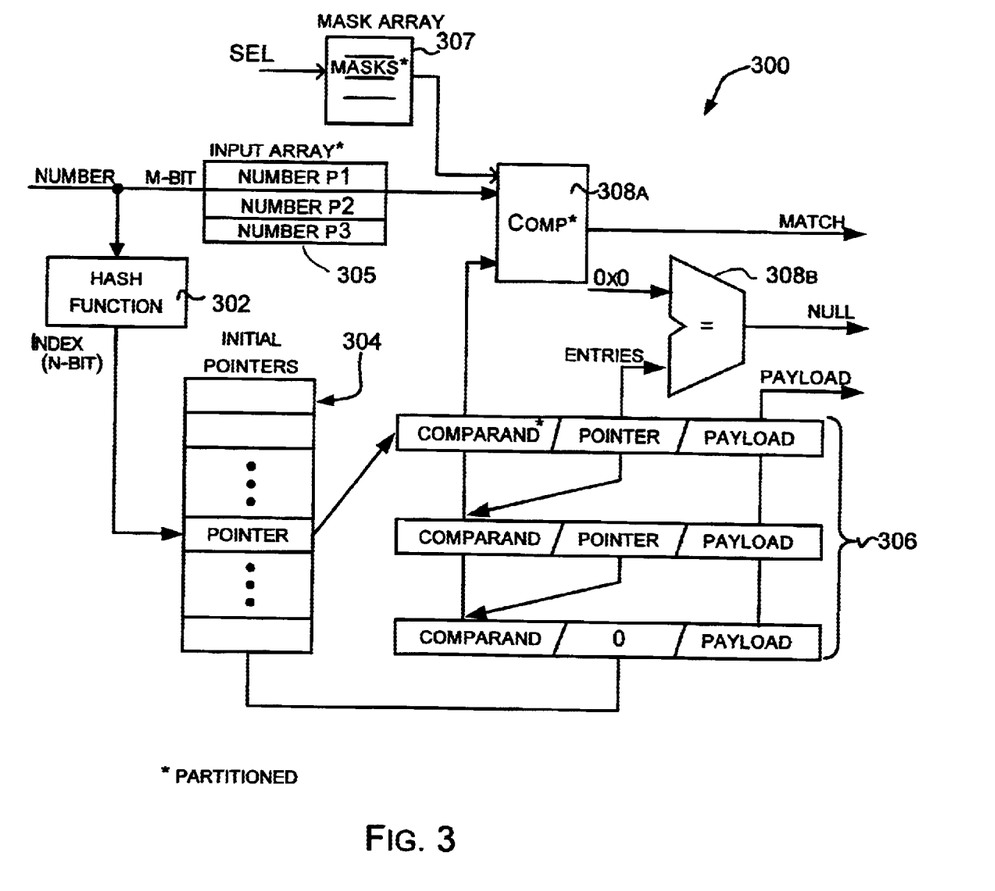
FIG. 3 illustrates the hash CAM of the present invention in accordance with another embodiment.

Referring now to FIG. 3, wherein the hash CAM of the present invention in accordance with another embodiment is shown. As illustrated, hash CAM 300 of the present invention is again similarly constituted with hash function 302, pointer array 304, memory array 306, and comparison circuitry 308a–308b, as in the prior art. However, in accordance with the present invention, hash CAM 300 is further provided with input array 305 to store the m-bit input in a partitioned manner suitable for successive output in portions of size m/p, where m is greater than or equal to p. Additionally, the comparands are also stored in memory array 306 in the same partitioned manner. For the illustrated embodiment, hash CAM 300 is still further provided with mask array 307. As will be described in more detail below, the incorporation of input array 305, coupled with the novel "partitioned" method of operation of the present invention, advantageously require less logic, as compared to the prior art. Furthermore, enhanced hash CAM 300 is particularly suited for the employment of RAM that supports "burst mode" accesses. As will be apparent from the description to follow, the larger the design point is for m, the greater is the improvement. Furthermore, the incorporation of mask array 307 enables hash CAM 300 to support applications with different size m-bit inputs at the same time.

Hash function 302 is used similarly to hash an m-bit input value to an n-bit index, where m and n are also positive integers, with m greater than n. Pointer array 304 is similarly designed to store up to $2^n$ pointers pointing to the starting memory locations of up to $2^n$ corresponding threaded lists of entries. Memory array 306 is similarly designed to store a fraction of $2^n$ threaded lists of entries. In one embodiment, memory array 306 is designed to store about ¼ of the $2^n$ threaded lists of entries. Each entry similarly includes a comparand, a payload, and a next entry pointer. However, in accordance with the present invention, to facilitate faster operation with long m-bit inputs, large m, as alluded to earlier, each comparand is stored in a partitioned manner, suitable to be successively output in portions of size m/p (where p is the number of partition, see also FIG. 4 where a 3-stage partition embodiment is shown). As alluded to earlier, in one embodiment, memory array 306 is a memory of the type that supports burst mode access, i.e. successively outputting multiple data responsive to one read address. The nature of the payloads remains application dependent. The payload may still be various types of network addresses (including but not limited to the earlier mentioned MAC addresses or IP (Internet Protocol) addresses, for various networking applications. The m-bit input may be formed in part or in whole in accordance with a received address.

Input array 305 is designed to store the m-bit input in a like partitioned manner, suitable to be successively output in portions of size m/p. Likewise, input array 305 is also preferably of a type that supports burst output.

Figure 4:
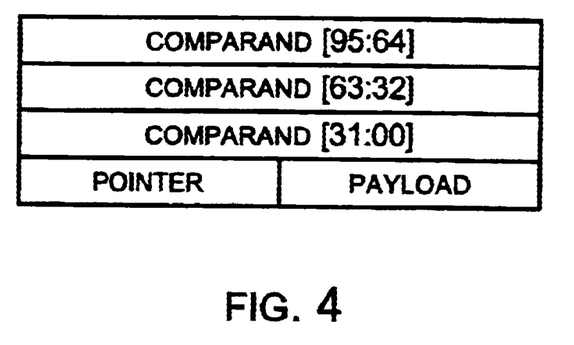
FIG. 4 illustrates one entry in the memory array of FIG. 3 in further detail, in accordance with one embodiment.

Comparison circuitry 308a is used to cumulatively determine if an m-bit comparand matches an m-bit input, by successively comparing the corresponding portions of size m/p. For the 3-stage embodiment of FIG. 4, in one embodiment, comparison circuitry 308a operates in accordance with a three stage process given by the following equations:

noMatch<=(1$^{st}$ m/p portion of input ^ 1$^{st}$ m/p portion of comparand)!=0    1)

noMatch<=noMatch II ((2$^{nd}$ m/p portion of input ^2$^{nd}$ m/p portion of comparand)!=0)    2)

noMatch<=noMatch II ((3$^{rd}$ m/p portion of input ^3$^{re}$ m/p portion of comparand)!=0)    3)

where noMatch is the output signal, and it is re-circulated as one of the inputs in each of the subsequent stages. In the above equations, "^" represents the vector-wide EXCLUSIVE-OR operation in which the bits of one vector are EXCLUSIVE-ORed with corresponding bits of a second vector to create a third vector, and "II" represents a logical OR operation.

Thus, comparison circuitry 308a is able to handle long m-inputs with a comparator that is m−m/p bits narrower, than an implementation in accordance with the prior art. This narrower comparator has at most 1/p of the electronic elements otherwise required. That is, at least (p−1)/p of the circuit elements otherwise required to perform m−m/p bit comparisons may be eliminated. Experience has shown that this cumulative, staged approach employing fewer electronic elements, in addition to taking up less space, actually can make the match determination in less time, than a single stage larger implementation. Again, the speed up could be substantial for large ms.

Note that in alternate embodiments, depending on the applications, the present invention may also be practiced with comparison circuitry 308a being replaced with other combinatorial circuitry to determine if the m-bit input has a predetermined relationship to a stored m-bit comparand.

As to comparator 308b, as in the prior art, it is used to determine if the next pointer is a null pointer or not.

Figure 5:
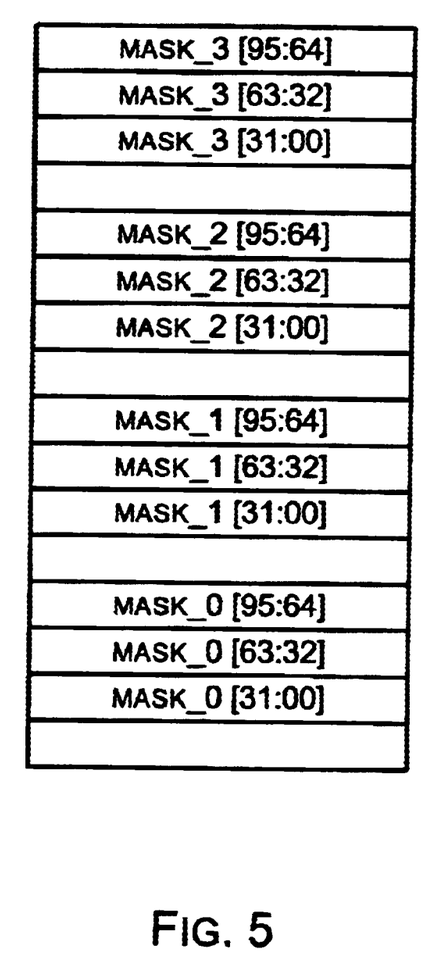
FIG. 5 illustrates the mask array of FIG. 3 in further detail, in accordance with one embodiment.

Mask array 307 is used to store a number of partitioned masks with portion size m/p, to allow hash CAM 300 to concurrently operate for different sized inputs. Under these embodiments, m would be at least as big as the largest size input to be supported. Each mask would be employed to effectively reduce the "supersized" m-bit input to the actual size of the input of a particular application. A four mask embodiment is illustrated in FIG. 5. Depending on the values of each partitioned mask, each partitioned mask effective renders the m-bit input to a different sized input. For the four mask embodiment, a 2-bit mask index is employed to cause the appropriate mask to be output and taken into consideration (to effective reduce the "supersized" input) at comparison time. The comparison circuitry 308a of the earlier described 3-stage embodiment of FIG. 4, in accordance with one embodiment, may operate in accordance with a three stage process given by the following equations instead:

misMatch[7]<=((input[31:28]^comparand[31:28]) & mask[31:28])!=0 misMatch[6]<=((input[27:24]^comparand[27:24]) & mask[27:24])!=0 misMatch[5]<=((input[23:20]^comparand[23:20]) & mask[23:20])!=0 misMatch[4]<=((input[19:16]^comparand[19:16]) & mask[19:16])!=0 misMatch[3]<=((input[15:12]^comparand[15:12]) & mask[15:12])!=0 misMatch[2]<=((input[11:8]^comparand[11:8]) & mask[11:8])!=0 misMatch[1]<=((input[7:4]^comparand[7:4]) & mask[7:4])!=0 misMatch[0]<=((input[3:0]^comparand[3:0]) & mask[3:0])!=0    1a)

noMatch<=misMatch!=0    1b)

repeat (1a) for bits [63:32]    2a)

noMatch<=noMatch II (misMatch!=0)    2b)

repeat (1a) for bits [95:64]    3a)

noMatch<=noMatch II ((misMatch!=0)    3b)

where misMatch[7:0] are eight bits registered at the beginning of each stage, taking into account the corresponding portion of the appropriate mask, and noMatch is the output signal, and it is re-circulated as one of the inputs in each of the subsequent stages as before. In the above equations, "&" represents the vector-wide AND operation in which the bits of one vector are ANDed with corresponding bits of a second vector to create a third vector, and "!=" represents a NOT EQUAL operation.

Thus, it can be seen from the above description, the FIG. 3 embodiment of hash CAM 300 of the present invention may achieve substantial speed up in looking up payloads for long m-bit inputs.

Referring now back to FIG. 3, while for ease of understanding, hash function 302 and comparison circuitry 308a have been described as conventional m to n hash function and conventional comparison circuitry respectively, whereas input array 305 and memory array 306 have been described as being employed to store the m-bit input and m-bit comparands in complementary partitioned manner of size m/p. However, hash function 302 may also be of a type where the n-bit index for each of 2$^n$ m-bit inputs having m−n common bits, is always unique. Therefore, a reduced size memory array 306 storing only r bits of each of the potential m-bit input may be employed as earlier described referencing FIG. 2. Accordingly, memory array 306 may be employed to store the truncated r-bit comparands in portions of r/p instead (as opposed to merely m/p). In like manner, input array may be used to store the corresponding r bits of the m-bit input in portions of r/p instead (as opposed to m/p). Circuitry 308a may be further reduced in size to compare the r/p bit portions in succession (as opposed to m/p bit portions in succession).

Of course, for such alternate embodiment, if mask array 307 is also employed as earlier described, it too may be reduced in width by storing r-bit masks in r/p portions.

Figure 6:
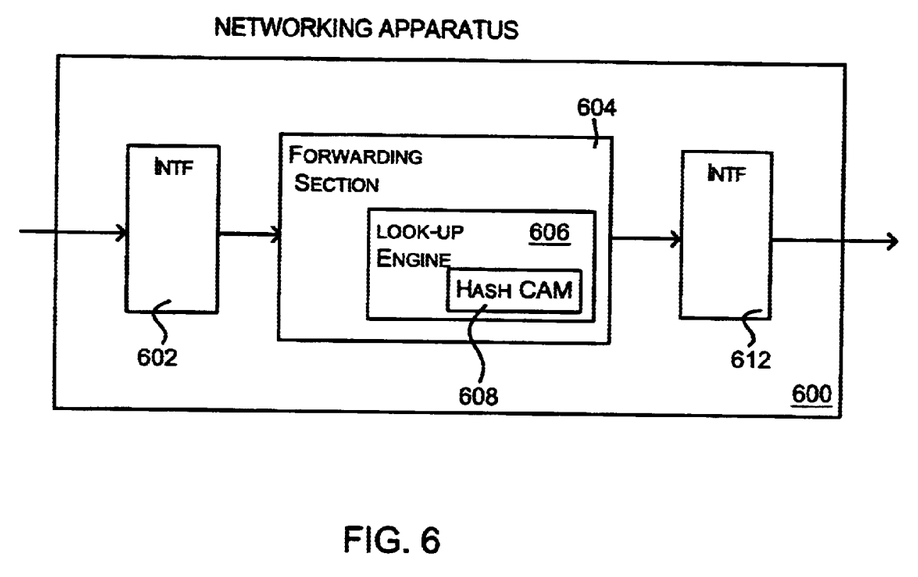
FIG. 6 illustrates an example application of the hash CAM of the present invention.

Referring now to FIG. 6, wherein an example application of the present invention is shown. As illustrated, networking device 600 includes first and second I/O interfaces 602 and 612 and forwarding section 604. Forwarding section 604 includes look-up engine 606, which is provided with hash CAM 608 incorporated with the teachings of the present invention. In one embodiment, hash CAM 608 includes the space saving teachings of FIG. 2. In another embodiment, hash CAM 608 includes the speed up and multiple-size input teachings of FIGS. 3–5. In yet another embodiment, hash CAM 608 includes the space saving teachings of FIG. 2 as well as the speed up and multiple-size input teachings of FIG. 3–5. Except for hash CAM 608, networking device 600 is intended to represent a broad range of networking devices known in the art, including but not limited to routers, switches and gateways.

Accordingly, a novel hash CAM and its application have been described.

Epilogue

From the foregoing description, those skilled in the art will recognize that many other variations of the present invention are possible. Thus, the present invention is not limited by the details described, instead, the present invention can be practiced with modifications and alterations within the spirit and scope of the appended claims.

What is claimed is:

1. A hash CAM comprising:
   a first memory array to store an m-bit input in a partitioned manner suitable for being subsequently output in a successive manner in portions of size m/p, where p is the number of partitions, and m and p are positive integers, with m being greater than or equal to p;
   a second memory array to store a plurality of threaded lists of entries, with each entry having a comparand also m-bits in size and stored in the same partitioned manner suitable for being selectively output in the same successive manner in portions of size m/p, responsive to an n-bit index generated in accordance with said m-bit input, with n being also a positive integer, but smaller than m, wherein each n-bit index is unique to the m-bit input having m−n bits in common with another m-bit input; and
   comparison circuitry coupled to said first and second memory arrays, complementarily reduced in width in accordance with said first and second memory arrays, to successively compare corresponding portions of said m-bit input and the selectively output comparand(s) to cumulatively determine if the m-bit input matches one of the output comparands.

2. The hash CAM of claim 1, wherein the comparison circuitry includes logic to accumulate comparison results of said successive comparisons.

3. The hash CAM of claim 2, wherein the logic of the comparison circuitry comprises circuitry to generate a signal based on a comparison of corresponding first portions of the m-bit input and an output comparand, and to successively modify the signal in accordance with successive comparisons of corresponding successive portions of the m-bit input and the output comparand.

4. The hash CAM of claim 1, wherein the hash CAM further comprises a hashing unit coupled to the second memory array to generate said n-bit index for said second memory array in accordance with said m-bit input.

5. The hash CAM of claim 1, wherein the hash CAM further comprises a third memory unit coupled to the comparison circuitry, to store a plurality of m-bit masks in the same partitioned manner suitable for being selectively output in the same successive manner in portions of size m/p for inclusion by the comparison circuitry in said cumulative determination of relationship between the m-bit input and the output comparands.

6. In a hash CAM, a method of operation comprising:
   storing an m-bit input in a partitioned manner suitable for being subsequently output in a successive manner in portions of size m/p, where p is the number of partitions, and m and p are positive integers, with m being greater than or equal to p;
   storing threaded lists of entries, with each entry having an m-bit comparand also stored in the same partitioned manner suitable for being selectively output in the same successive manner in portions of size m/p, responsive to an n-bit index generated in accordance with said m-bit input, with n being also a positive integer, but smaller than m, wherein the n-bit index is unique to said m-bit input having m−n bits in common with another m-bit input; and
   successively outputting corresponding portions of said m-bit input and a selected one of the comparand(s), and cumulatively determining if the m-bit input matches one of the output comparands.

7. The method of claim 6, wherein said successively outputting and cumulative determining further comprises successively outputting corresponding portions of a selected one of a plurality of m-bit masks, stored in the same partitioned manner, and including said corresponding portions of the selected m-bit mask in said cumulative determination of relationship between the m-bit input and the output comparands.

8. In a look-up engine, a method of operation comprising:
   storing a plurality of threaded lists of entries, with each entry having data and an associated m-bit comparand stored in a partitioned manner;
   generating a n-bit index for a m-bit input, where m and are positive integers with m greater than n, wherein the n-bit index is unique to said m-bit input having m−n bits in common with another m-bit input;
   retrieving a selected one of said stored data based at least in part on the m-bit input's relationship with said comparands, cumulatively determined using corresponding partitioned portions of said m-bit input and said comparands; and
   cumulatively determining the m-bit input's relationship with said comparands, including successively outputting said corresponding portions of said m-bit input and a selected one of said comparands.

9. The method of claim 8, wherein cumulatively determining the m-bit input's relationship with said comparands further comprises successively outputting corresponding portions of a selected one of a plurality of m-bit masks, stored in the same partitioned manner, using the corresponding portions to make said cumulative determination.

10. In a networking apparatus, a method of operation comprising:
    storing a plurality of threaded lists of entries, with each entry having data and an associated m-bit comparand stored in a partitioned manner;
    forming a m-bit input based in part or in whole on an address;
    generating a n-bit index for said m-bit input, where n and n are positive integers with m greater than n, wherein the n-bit index is unique to said m-bit input having m−n bits in common with another m-bit input;
    retrieving a selected one of said stored data for said address based at least in part on the m-bit input's relationship with said comparands, cumulatively determined using corresponding portions of said m-bit input and said comparands; and
    cumulatively determining the m-bit input's relationship with said comparands, including successively outputting said corresponding portions of said m-bit input and a selected one of said comparands.

11. The networking method of claim 10, wherein cumulatively determining the m-bit input's relationship with said comparands further comprises successively outputting corresponding portions of a selected one of a plurality of m-bit masks, stored in the same partitioned manner, using the corresponding portions to make said cumulative determination.

12. An apparatus comprising:
    a hash CAM to truncate n bits of one or more first m-bit inputs to generate r-bit comparands, store a plurality of data and said r-bit comparands associated with said data, compare one or more r-bit comparands and r-bits of a second m-bit input that correspond to said r bits of said comparands, and output one of said stored data if said corresponding r-bits of said second m-bit input match said r-bits of a comparand associated with said one of said stored data, with m and r being positive integers, and m being greater than r; and access circuitry coupled to said hash CAM to retrieve appropriate ones of said stored data for various m-bit inputs.

13. The apparatus of claim 12, wherein the hash CAM comprises:

a first memory array to store said r bits of said second m-bit input in a partitioned manner suitable for being subsequently output in a successive manner in portions of size r/p, where p is the number of partitions, and p is also a positive integer, and r being greater than or equal to p;

a second memory array to store said plurality of data and said r-bit comparands, with each r-bit comparand being also stored in the same partitioned manner suitable for being selectively output in the same successive manner in portions of size r/p, responsive to an n-bit index generated in accordance with said second m-bit input, with n being also a positive integer, but smaller than m, and m−r being less than or equal to n, wherein said n-bit index is unique for each second m-bit input having m−n bits in common with another second m-bit input; and comparison circuitry coupled to said first and second memory arrays, complementarily reduced to r bits in size, to successively compare corresponding portions of said r bits of the m-bit input and the selectively output r-bit comparand(s) to cumulatively determine if the said corresponding r-bits of said second m-bit input to match one of the output r-bit comparands.

14. The apparatus of claim 13, wherein the comparison circuitry of the hash CAM includes logic to accumulate comparison results of said successive comparisons.

15. The apparatus of claim 14, wherein the logic of the comparison circuitry comprises circuitry to generate a signal based on a comparison of corresponding first portions of the r-bits of the second m-bit input and an output r-bit comparand, and to successively modify the signal in accordance with successive comparisons of corresponding successive portions of the second m-bit input and the output r-bit comparand.

16. The apparatus of claim 13, wherein the hash CAM further comprises a hashing unit coupled to the second memory array to generate said n-bit index for said second memory array in accordance with said second m-bit input.

17. The apparatus of claim 13, wherein the hash CAM further comprises a third memory unit coupled to the comparison circuitry, to store a plurality of r-bit masks in the same partitioned manner suitable for being selectively output in the same successive manner in portions of size r/p for inclusion by the comparison circuitry in said cumulative determination of relationship matching between the r-bits of the second m-bit input and the output r-bit comparands.

18. The apparatus of claim 12, wherein the apparatus is a sub-assembly including a look-up engine to look up data associated with m-bit inputs, and said hash CAM and access circuitry are part of said look-up engine.

19. The apparatus of claim 12, wherein the apparatus is a networking device including a forwarding section to look up data associated with addresses, and said hash CAM and access circuitry are part of said forwarding section, said second m-bit input being formed in part or in whole with one of said addresses.

20. The apparatus of claim 19, wherein the networking device is a networking device selected from a group consisting of a gateway, a router, and a switch.

21. The apparatus of claim 19, wherein said m-bit addresses are addresses selected from a group consisting of IP addresses and MAC addresses.

22. In a look-up engine, a method of operation comprising:

storing data and associated r-bit comparands;

generating a n-bit index for a m-bit input, where m, n and r are positive integers with m−r being less than or equal to n, wherein the n-bit index is unique for said m-bit input having m−n bits in common with another m-bit input;

retrieving a selected one of said stored data based at least in part on the m-bit input's relationship with said r-bit comparands, cumulatively determined using corresponding portions of r selected bits of said m-bit input and said r-bit comparands.

23. The method of claim 22, wherein the method further comprises cumulatively determining the m-bit input's relationship with said r-bit comparands, including successively outputting said corresponding portions of r selected bits of said m-bit input, a selected one of said r-bit comparands, and a selected one of a plurality of r-bit masks, stored in the same partitioned manner, using the corresponding portions to make said cumulative determination.

24. In a networking apparatus, a method of operation comprising:

storing data and associated r-bit comparands;

forming a m-bit input based in part or in whole on an address;

generating a n-bit index for said m-bit input, where m, n and r are positive integers with m−r being less than or equal to n, wherein the n-bit index is unique for said m-bit input having m−n bits in common with another m-bit input; and retrieving a selected one of said stored data for said address based at least in part on the m-bit input's relationship with said r-bit comparands, cumulatively determined using corresponding portions of r selected bits of said m-bit input and said r-bit comparands.

25. The networking method of claim 24, wherein the method further comprises cumulatively determining the m-bit input's relationship with said r-bit comparands, including successively outputting said corresponding portions of r selected bits of said m-bit input, a selected one of said r-bit comparands, and a selected one of a plurality of r-bit masks, stored in the same partitioned manner, using the corresponding portions to make said cumulative determination.

26. A hash CAM comprising:

a first memory array to store r-bit comparands generated from truncated first m-bit inputs, and store data associated with said r-bit comparands, wherein said r-bit comparands are output in response to an n-bit index generated in accordance with a second m-bit input, with m, n and r being positive integers, n being smaller than m, and m−r being less than or equal to n, wherein each n-bit index is unique to the second m-bit input having m−n bits in common with another second m-bit input;

a second memory array to store r selected bits of the second m-bit input, wherein said r selected bits correspond to r bits of said r-bit comparands; and comparison circuitry r bits in size, coupled with said first and second memory arrays, to compare said r bits of said second m-bit input and an output r-bit comparand to determine whether said r-bits of said second m-bit input match said output r-bit comparand.

27. A method, comprising:

receiving one or more first m-bit inputs;

truncating a number of bits n of each m-bit entry, where m is greater than n;

storing each truncated first m-bit input as a r-bit comparand, where r equals m−n;

receiving a second m-bit input;

generating a n-bit index for the second m-bit input, wherein said n-bit index is unique for the second m-bit input having m−n bits in common with another second m-bit input;

selecting r-bits of said second m-bit input that correspond to said r-bits of said r-bit comparands;

outputting an r-bit comparand in response to said n-bit index associated with said second m-bit input;

determining whether said r-bits of said comparand match said corresponding r-bits of said second m-bit input; and retrieving, if said r-bits of said comparand match said corresponding r-bits of said second m-bit input, data associated with said r-bit comparand.

* * * * *

UNITED STATES PATENT AND TRADEMARK OFFICE
CERTIFICATE OF CORRECTION

PATENT NO.    : 6,671,771 B2
DATED         : December 30, 2003
INVENTOR(S)   : Perloff It is certified that error appears in the above-identified patent and that said Letters Patent is hereby corrected as shown below:

<u>Column 9,</u>
Line 56, delete "relationship".

Signed and Sealed this

Sixteenth Day of March, 2004

JON W. DUDAS
*Acting Director of the United States Patent and Trademark Office*